(12) United States Patent
Yamamoto

(10) Patent No.: US 8,471,457 B2
(45) Date of Patent: Jun. 25, 2013

(54) TRANSPARENT PLATE WITH TRANSPARENT CONDUCTIVE FILM AND ORGANIC ELECTROLUMINESCENCE ELEMENT

(75) Inventor: Kyoko Yamamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 297 days.

(21) Appl. No.: 12/863,906

(22) PCT Filed: Jan. 23, 2009

(86) PCT No.: PCT/JP2009/051521
§ 371 (c)(1),
(2), (4) Date: Jul. 21, 2010

(87) PCT Pub. No.: WO2009/096498
PCT Pub. Date: Aug. 6, 2009

(65) Prior Publication Data
US 2010/0295446 A1 Nov. 25, 2010

(30) Foreign Application Priority Data
Jan. 31, 2008 (JP) .................. 2008-020885

(51) Int. Cl.
*H01L 51/52* (2006.01)
*H01L 51/54* (2006.01)
*H01L 51/56* (2006.01)
*H01J 9/32* (2006.01)
*H01J 9/26* (2006.01)
*H01J 9/24* (2006.01)
*H01J 9/00* (2006.01)

(52) U.S. Cl.
USPC ............. 313/503; 313/506; 445/24; 445/25

(58) Field of Classification Search
USPC ........... 313/498–512; 257/E33.061, E33.001, 257/E33.064, E33.012, E33.073, E33.074, 257/88, 79, E21.024; 438/22, 29, 39, 40, 438/42, 43; 445/24–25; 428/22, 29, 39, 40, 428/42, 43
See application file for complete search history.

(56) References Cited

U.S. PATENT DOCUMENTS
8,167,675 B2 * 5/2012 Yukinobu et al. ............... 445/24
2003/0071567 A1 4/2003 Eida et al.
(Continued)

FOREIGN PATENT DOCUMENTS
CN 1389085 A 1/2003
CN 1729310 B 4/2010
(Continued)

OTHER PUBLICATIONS

Machine-generated translation of JP 07-106068, published Apr. 21, 1995, to Fukuvi Chem. Ind. Co., Ltd.

(Continued)

*Primary Examiner* — Anne Hines
*Assistant Examiner* — Jose M Diaz
(74) *Attorney, Agent, or Firm* — Sughrue Mion, PLLC

(57) ABSTRACT

A transparent plate with a transparent conductive film for an organic electroluminescent element, comprising a transparent plate main body and a transparent conductive film formed on a surface of the transparent plate main body, wherein when the refractive index of the transparent conductive film is represented by n1, and the refractive index of the transparent plate main body is represented by n2, n1 and n2 satisfy the following Expression (1):

$$\begin{cases} |n2 - n1| < 0.4 \\ n1 \le 1.8, \end{cases} \quad \text{Expression (1)}$$

and the transparent conductive film has a transmittance of light in a visible region of 80% or more, a volume resistivity of 1 Ω·cm or less, and a surface roughness of 100 nm or less.

11 Claims, 1 Drawing Sheet

U.S. PATENT DOCUMENTS

| | | | |
|---|---|---|---|
| 2004/0086717 A1 | 5/2004 | Sasaki et al. | |
| 2004/0150326 A1 | 8/2004 | Shibata | |
| 2007/0074316 A1 | 3/2007 | Alden et al. | |
| 2008/0008893 A1* | 1/2008 | Bright | 428/458 |
| 2009/0001883 A1* | 1/2009 | Fiebranz | 313/504 |
| 2009/0072733 A1 | 3/2009 | Funayama et al. | |
| 2011/0074282 A1* | 3/2011 | Bright | 313/504 |

FOREIGN PATENT DOCUMENTS

| | | |
|---|---|---|
| EP | 1860919 A1 | 11/2007 |
| JP | 7-106068 A | 4/1995 |
| JP | 2002-231443 A | 8/2002 |
| JP | 2004-196923 A | 7/2004 |
| JP | 2005-327910 A | 11/2005 |
| JP | 2006-73321 A | 3/2006 |
| JP | 2006286616 | 10/2006 |
| WO | 02/17689 A1 | 2/2002 |
| WO | WO 2007076913 A1 * | 7/2007 |

OTHER PUBLICATIONS

Machine-generated translation of JP 2005-327910 published Nov. 24, 2005, to Nissan Motor Co., Ltd.

Machine-generated translation of JP 2002-231443 published Aug. 16, 2002, to Sony Corp.

M. Jurado-Gonzalez et al., "A new solid acid catalyst: the first phosphonate and phosponic acid functionalised microporous polysilsesquioxanes", Chem. Commun., 2001, pp. 67-68.

C. Ducamp-Sanguesa et al., "Synthesis and Characterization of Fine and Monodisperse Silver Particles of Uniform Shape", Journal of Solid State Chemistry, vol. 100, 1992, pp. 272-280.

Supplementary European Search Report issued in Application No. 09705739.2 dated Apr. 23, 2012.

Chinese Office Action issued on Aug. 14, 2012 by the Chinese Patent Office in Application No. 200980103241.6, with an English language translation.

Chinese Office Action issued on Nov. 9, 2011 by the Chinese Patent Office in Application No. 200980103241.6, with an English language translation.

Japanese Office Action issued on Feb. 5, 2013 by the Japanese Patent Office in Japanese Patent Application No. 2008-020885.

* cited by examiner

TRANSPARENT PLATE WITH TRANSPARENT CONDUCTIVE FILM AND ORGANIC ELECTROLUMINESCENCE ELEMENT

CROSS REFERENCE TO RELATED APPLICATIONS

This application is a National Stage of International Application No. PCT/JP2009/051521 filed Jan. 23, 2009, claiming priority based on Japanese Patent Application No. 2008-020885 filed Jan. 31, 2008, the contents of all of which are incorporated herein by reference in their entirety.

TECHNICAL FIELD

The present invention relates to a transparent plate with a transparent conductive film used for an organic electroluminescent element, a method for producing the transparent plate, and the organic electroluminescent element.

BACKGROUND ART

An organic electroluminescent (abbreviated to EL) element includes a pair of electrodes and a light emitting layer provided between the electrodes and containing an organic substance, and the light emitting layer emits light when a voltage is applied to between the electrodes. Since the light from the light emitting layer is extracted through at least one of the paired electrodes, it is necessary that the electrode through which the light is extracted is transparent. For example, an organic EL element on a transparent plate with a transparent conductive film is obtained by forming the transparent conductive film on the transparent plate and the light from the light emitting layer is extracted to the outside of the organic EL element by using the transparent conductive film as the transparent electrode. As a transparent conductive film to be used for a transparent electrode, a thin film formed from a metal oxide such as indium tin oxide (ITO) has been known, for example.

DISCLOSURE OF THE INVENTION

Light extraction efficiency of conventional organic EL elements including a transparent plate with a transparent conductive film is not satisfactory, and there is a demand for an organic EL element having high light extraction efficiency.

An object of the present invention is to provide a transparent plate for organic EL elements which realizes an organic EL element having high light extraction efficiency, a method for producing the same, and an organic EL element.

The present invention is a transparent plate with a transparent conductive film for an organic electroluminescent element, comprising a transparent plate main body and a transparent conductive film formed on a surface of the transparent plate main body, wherein when the refractive index of the transparent conductive film is represented by n1, and the refractive index of the transparent plate main body is represented by n2, n1 and n2 satisfy the following Expression (1):

$$\begin{cases} |n2 - n1| < 0.4 \\ n1 \leq 1.8, \end{cases} \quad \text{Expression (1)}$$

and the transparent conductive film has a transmittance of light in a visible region of 80% or more, a volume resistivity of 1 $\Omega \cdot cm$ or less, and a surface roughness of 100 nm or less.

The present invention is also the transparent plate with the transparent conductive film, wherein the transparent conductive film is formed by an application method.

The present invention is also the transparent plate with the transparent conductive film, wherein
the transparent conductive film includes:
a transparent film main body and
a wire-like conductor arranged in the film main body and having conductivity.

The present invention is also the transparent plate with the transparent conductive film, wherein the wire-like conductor has a diameter of 200 nm or less.

The present invention is also the transparent plate with the transparent conductive film, wherein the wire-like conductor forms a network structure in the film main body.

The present invention is also the transparent plate with the transparent conductive film, wherein the film main body includes a resin having conductivity.

The present invention is also the transparent plate with the transparent conductive film, wherein the transparent plate main body is a sealing film.

The present invention is also an organic electroluminescent element comprising:
a transparent plate with the transparent conductive film;
a first electrode; and
an organic member positioned between the transparent plate with the transparent conductive film and the first electrode and including a light emitting layer containing an organic substance, wherein
the transparent conductive film of the transparent plate is positioned closer to the first electrode than the transparent plate main body and functions as a second electrode that is different from the first electrode.

The present invention is also the organic electroluminescent element, wherein the transparent conductive film of the transparent plate is an anode.

The present invention is also the organic electroluminescent element, wherein the transparent conductive film of the transparent plate is a cathode.

The present invention is also a method for producing a transparent plate with a transparent conductive film for an organic electroluminescent element, comprising:
preparing a transparent plate main body, and
forming a transparent conductive film by applying a dispersion liquid obtained by dispersing a wire-like conductor having conductivity in a dispersion medium to a surface of the transparent plate main body, wherein
when the refractive index of the transparent conductive film is represented by n1 and the refractive index of the transparent plate main body is represented by n2, n1 and n2 satisfy the following Expression (1):

$$\begin{cases} |n2 - n1| < 0.4 \\ n1 \leq 1.8, \end{cases} \quad \text{Expression (1)}$$

and
a transparent conductive film having a transmittance of light in a visible region of 80% or more, a volume resistivity of 1 $\Omega \cdot cm$ or less, and a surface roughness of 100 nm or less is formed on a surface of the transparent plate main body.

The present invention is also a method for producing a transparent plate with a transparent conductive film for an organic electroluminescent element having an organic member containing an organic substance, comprising:

forming the transparent conductive film by applying a dispersion liquid obtained by dispersing a wire-like conductor having conductivity in a dispersion medium to the organic member, and forming the transparent sealing film covering at least the transparent conductive film, wherein when the refractive index of the transparent conductive film is represented by n1 and a refractive index of the sealing film is represented by n2, n1 and n2 satisfy the following Expression (1):

$$\begin{cases} |n2 - n1| < 0.4 \\ n1 \leq 1.8, \end{cases} \quad \text{Expression (1)}$$

and the transparent plate including the transparent conductive film having a transmittance of light in a visible region of 80% or more, a volume resistivity of 1 Ω·cm or less, and a surface roughness of 100 nm or less and a transparent sealing film covering the transparent conductive film is formed.

DESCRIPTION OF REFERENCE NUMERALS

Figure 1:
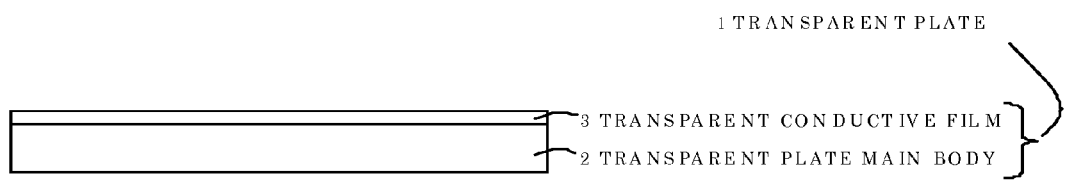
FIG. 1 is a front view showing a transparent plate 1 with a transparent conductive film according to one embodiment of the present invention.

1: transparent plate
2: transparent plate main body
3: transparent conductive film
5, 11: organic EL element
7: organic member
8, 13: first electrode
9, 14: second electrode
12: substrate

MODE FOR CARRYING OUT THE INVENTION

FIG. 1 is a front view showing a transparent plate 1 with a transparent conductive film according to one embodiment of the present invention. The transparent plate 1 is used for an organic electroluminescent element (hereinafter referred to as organic EL element in some cases) described later and capable of improving light extraction efficiency of the organic EL element by suppression of light reflection on the transparent plate 1 in the organic EL element. The organic EL element to be provided with the transparent plate 1 of the present embodiment is used for a display such as a full-color display device and an area color display device, an illuminating device, and the like and particularly suitably used for the illuminating device.

The transparent plate 1 includes a transparent plate main body 2 and a transparent conductive film 3 formed on a surface of the transparent plate main body 2. In the organic EL element provided with the transparent plate 1 of the present embodiment, an organic member containing an organic substance is provided on a surface (surface of transparent plate 1) opposite to the transparent plate main body 2 among surfaces of the transparent conductive film 3. The organic member is provided at least with a light emitting layer containing the organic substance. It is characterized in that in the case where refractive indexes of the transparent conductive film 1 and the transparent plate main body 2 are n1 and n2, n1 and n2 satisfy the following Expression (1):

$$\begin{cases} |n2 - n1| < 0.4 \\ n1 \leq 1.8, \end{cases} \quad \text{Expression (1)}$$

and the transparent conductive film 3 has a transmittance of light in a visible region of 80% or more, a volume resistivity of 1 Ω·cm or less, and a surface roughness Ra of 100 nm or less. Further, when the refractive index of a surface part of the organic member close to the transparent conductive film 3 is represented by n3, the refractive index (n1) of the transparent plate main body 2 may be preferably n3 or less (n1≦n3).

The transparent plate 1 is used as a substrate for organic EL elements or a sealing plate for organic EL elements. In the case of using the transparent plate 1 as a substrate, those having a high transmittance of light in a visible region and not changing in a step for forming an organic EL element are suitably used as the transparent plate main body 2, and a rigid plate or a flexible plate may be used without particular limitation. For example, a glass plate, a plastic plate, a polymer film, a silicon plate, a laminated plate obtained by laminating them, or the like is suitably used. In the case of using the transparent plate 1 as a sealing plate, the transparent plate main body 2 is realized by a sealing film that hardly allows permeation of oxygen, water vapor and the like contained in the atmosphere of the organic EL element, and, for example, an inorganic layer formed from a metal, a metal oxide, a metal nitride, a metal carbide, a metal oxynitride, or the like, a layer using the inorganic layer and an organic layer in combination, an inorganic-organic hybrid layer, or the like is suitably used. As the inorganic layer, one that is a thin layer and is stable in the air is preferred, and specific examples thereof include thin film layers of silica, alumina, titania, indium oxide, tin oxide, titanium oxide, zinc oxide, indium tin oxide, aluminum nitride, silicon nitride, silicon carbide, silicon oxynitride, and combinations thereof. The thin film layer may be more preferably formed from aluminum nitride, silicon nitride, or silicon oxynitride, further preferably from silicon oxynitride. As the transparent plate main body 2, one having a refractive index of which a difference from the refractive index of the transparent conductive film 3 is less than 0.3 is appropriately used among those exemplified above.

The transparent conductive film 3 is, as described later, used as the electrode of the organic EL element. The transparent conductive film 3 is composed of a transparent film main body and a wire-like conductor arranged in the film main body and having conductivity. As the transparent film main body, those having a high transmittance of light in a visible region is suitably used, and the transparent film main body contains a resin, an inorganic polymer, an inorganic-organic hybrid compound, and the like. Among the resins, the resin having conductivity is suitably used for the transparent film main body. By using the film main body having conductivity in addition to the wire-like conductor as described above, it is possible to achieve low electric resistance of the transparent conductive film 3. By using the low electric resistant transparent conductive film 3 as the electrode of the organic EL element, it is possible to suppress voltage drop in the electrode, thereby realizing low voltage driving of the organic EL element. A film thickness of the transparent conductive film 3 is appropriately set depending on the electric resistance and visible light transmittance and may be 0.03 to 10 μm, for example, more preferably 0.05 to 1 μm.

The wire-like conductor may preferably have a small diameter, and the diameter may be 400 nm or less, for example, preferably 200 nm or less, more preferably 100 nm or less.

A length of the wire-like conductor may be 1 μm or more, preferably 2 μm or more, and more preferably 5 μm or more.

The diameter (generally a shorter axis average length) of the wire-like conductor and the length (generally a longer axis average length) of the wire-like conductor are measured by SEM observation.

Since the wire-like conductor arranged in the film main body diffracts or scatters light passing through the transparent conductive film 3, the wire-like conductor increases a haze value of the transparent conductive film 3 and reduces the transmittance of light. However, it is possible to suppress the haze value with respect to a visible light as well as to improve the transmittance of light by using the wire-like conductor having the diameter equal to or smaller than a wavelength of the visible light. Also, since the electric resistance increases when the diameter of the wire-like conductor is too small, the diameter may preferably be 5 nm or more, more preferably 7 nm or more, and further preferably 10 nm or more. In the case of using the organic EL element for an illuminating device, for example, it is possible to additionally impart a diffusion function when the haze value of the transparent conductive film 3 is high to a certain extent. Therefore, since the transparent conductive film 3 having the high haze value may be suitably used as the transparent plate 1 for organic EL elements, the optical properties of the transparent conductive film 3 are appropriately set depending on the device for which the organic El element is used.

One or a plurality of the wire-like conductors may be arranged in the film main body, and the wire-like conductor or conductors may preferably form a network structure in the film main body. For example, in the film main body, one or a plurality of the wire-like conductors is/are arranged throughout the film main body as being complicatedly entangled to form a network structure. More specifically, a structure wherein one wire-like conductor is entangled or the plurality of wire-like conductors are arranged as being brought into contact with each other is spread two-dimensionally or three-dimensionally to form a network structure. It is possible to reduce the volume resistivity of the transparent conductive film 3 by the wire-like conductor forming a network structure. Also, at least a part of the wire-like conductor may preferably be arranged in a surface part that is opposite to the transparent plate main body 2 of the transparent conductive film 3. Since the wire-like conductor is arranged as described above, it is possible to reduce the electric resistance in the surface part of the transparent conductive film 3 and to use the transparent conductive film 3 as a suitable electrode having the low electric resistance. The wire-like conductor may be curved or acicular, and it is possible to realize the transparent conductive film 3 having the low volume resistivity insofar as the curved and/or acicular conductor or conductors is/are brought into contact with each other to form a network structure.

Hereinafter, a method for forming the transparent conductive film 3 will be described.

As a material for the wire-like conductor, a metal having low electric resistance, such as Ag, Au, Cu, Al, and alloys thereof, is suitably used. It is possible to produce the wire-like conductor by the method according to N. R. Jana, L. Gearheart, and C. J. Murphy (Chm. Commun., 2001, p 617-p 618) or the method according to C. Ducamp-Sanguesa, R. Herrera-Urbina, and M. Figlarz, et al. (J. Solid State Chem., Vol. 100, 1992, p 272-p 280), for example.

Examples of the method for forming the transparent conductive film 3 include a method of dispersing the wire-like conductor into a resin by blending the wire-like conductor with the resin by kneading, a method of forming a film by applying a dispersion liquid obtained by dispersing the wire-like conductor and a resin into a dispersion medium, a method of forming a film by applying and dispersing the wire-like conductor on and into a surface of a film made from a resin, and the like. Various additives such as a surfactant, an antioxidant and a dispersant may be added to the transparent conductive film 3 as required. A type of the resin is appropriately selected depending on the properties of the transparent conductive film 3, such as the refractive index, transmittance of light, and electric resistance. Since an amount of the wire-like conductor to be dispersed influences on the electric resistance, haze value, and transmittance of light of the transparent conductive film 3, the amount is appropriately set depending on the properties of the transparent conductive film 3.

It is possible to manufacture the transparent plate 1 of the present embodiment by firstly preparing the transparent plate main body 2 and forming the transparent conductive film 3 by applying the dispersion liquid obtained by dispersing the wire-like conductor having conductivity into a dispersion medium on the surface of the transparent plate main body 2.

The dispersion liquid is prepared by mixing the wire-like conductor and the resin with a dispersion medium. Any dispersion medium is usable insofar as it is capable of dissolving the resin, and examples thereof include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methylethylketone, ester-based solvents such as ethyl acetate, butyl acetate, and ethyl cellsolve acetate, and the like.

As the resin, those having high transmittance of light are preferred, and, also, in the case of applying a material for the organic EL element on the transparent conductive 3 in the production of the organic EL element, it is necessary that the resin be not dissolved into the coating liquid containing the material for the organic EL element. Specific examples of the resin include polyolefin-based resins such as low density or high density polyethylene, an ethylene-propylene copolymer, an ethylene-butene copolymer, an ethylene-hexene copolymer, an ethylene-octene copolymer, an ethylene-norbornene copolymer, an ethylene-domone copolymer, polypropylene, an ethylene-vinyl acetate copolymer, an ethylene-methylmethacrylate copolymer, an ionomer resin; polyester-based resins such as polyethylene terephthalate, polybutylene terephthalate, and polyethylene naphthalate; nylon-6, nylon-6,6, a metaxylenediamine-adipic acid polycondensate; amide-based resins such as polymethylmethacrylimide; acryl-based resins such as polymethyl methacrylate; styrene-acrylonitrile-based resins such as polystyrene, a styrene-acrylonitrile copolymer, a styrene-acrylonitrile-butadiene copolymer, and polyacrylonitrile; a hydrophobicized cellulose-based resin such as cellulose triacetate and cellulose diacetate; halogen-containing resins such as polyvinyl chloride, polyvinylidene chloride, polyvinylidene fluoride, and polytetrafluoroethylene; hydrogen-bonding resins such as polyvinyl alcohol, an ethylene-vinyl alcohol copolymer, and a cellulose derivative; engineering plastic-based resins such as a polycarbonate resin, a polysulfone resin, a polyether sulfone resin, a polyether ether ketone resin, a polyphenylene oxide resin, a polymethylene oxide resin, a polyarylate resin and a liquid crystal resin; and the like.

Also, from the viewpoint of not being dissolved into the coating liquid containing the material for the organic EL element, a heat-curable resin, a photo-curable resin, or a photoresist material is suitably used as the resin.

Among the exemplified resins, the resin having conductivity is suitably used, and examples thereof include polyaniline, a polythiophene derivative, and the like.

The refractive index of the transparent conductive film 3 predominantly depends on the refractive index of the film main body formed of the resin and the like. Since the refractive index of the transparent conductive film 3 predominantly depends on the type of the resin to be used, for example, it is possible to easily form the transparent conductive film 3 exhibiting the intended refractive index by selecting the resin to be used.

In the case where the dispersion liquid obtained by dispersing the wire-like conductor into a photosensitive material and a photo-curable monomer to be used for a photosensitive photoresist is used, it is possible to easily form the transparent conductive film 3 having a predetermined pattern shape by a application method and photolithography.

As the transparent conductive film 3, those which do not deform at a heating temperature in a step of forming the organic EL element are preferred, and a glass transition point Tg of the resin forming the transparent conductive film 3 may preferably be 150° C. or more, more preferably 180° C. or more, and further preferably 200° C. or more. Examples of the resin include polyethersulfone having the glass transition point Tg of 230° C., a highly heat resistant photoresist material, and the like.

It is possible to appropriately set a dispersion amount of the wire-like conductor and use of a binder and an additive depending on conditions such as easiness of film formation and properties of the transparent conductive film 3.

An amount of the resin may usually be 5 to 5000 parts by weight, and preferably 10 to 2000 parts by weight, with respect to 100 parts by weight of the wire-like conductor.

An amount of the dispersion medium may usually be 5 to 5000 parts by weight, and preferably 20 to 2000 parts by weight, with respect to 100 parts by weight of the wire-like conductor.

Examples of an application method of the dispersion liquid obtained by dispersing the wire-like conductor include the methods usually employed in the industrial fields, such as a dipping method, an application method using a bar coater, an application method using a spin coater, a doctor blade method, a spray coating method, a screen mesh printing method, brushing coating, spraying, and roll coating.

Figure 2:
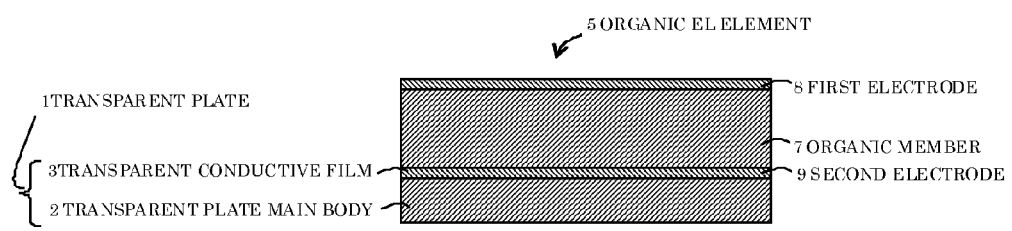
FIG. 2 is a sectional view showing an organic EL element 5 according to the embodiment.

Hereinafter, an organic EL element provided with the transparent plate 1 of the present embodiment will be described. FIG. 2 is a sectional view showing an organic EL element 5 according to the present embodiment. In the organic EL element 5 shown in FIG. 2, a mode wherein the transparent plate 1 is used as a substrate is illustrated.

The organic El element 5 of the present embodiment includes the transparent plate 1 with a transparent conductive film, a first electrode 8, and an organic member 7 positioned between the transparent plate with a transparent conductive film and the first electrode and containing an organic substance, wherein the transparent conductive film 3 of the transparent plate 1 functions as a second electrode 9 that is different from the first electrode 8. In the present embodiment, the transparent conductive film 3 of the transparent plate 1 and the organic member 7 are arranged in contact with each other.

Though it is sufficient that the organic member 7 is provided with at least one light emitting layer, a laminate obtained by providing one layer or a plurality of layers may be formed between the light emitting layer and the first electrode 8 and/or between the light emitting layer and the second electrode 9, or the organic member 7 may be composed only of the light emitting layer. The organic member 7 may include an inorganic layer made of an inorganic compound, and, for example, the inorganic layer may be arranged on a surface part of the organic member 7 contacting the transparent conductive film 3 as described later in this specification.

The organic EL element 5 of the present embodiment is of a so-called bottom emission type in which light from the light emitting layer is extracted through a substrate (the transparent plate 1 in the present embodiment), wherein the first electrode 8 serves as a cathode, and the second electrode 9 serves as an anode.

Examples of the layer to be provided between the cathode and the light emitting layer include an electron injection layer, an electron transport layer, a hole blocking layer, and the like. In the case where both of the electron injection layer and the electron transport layer are provided between the cathode and the light emitting layer, the layer positioned close to the cathode is referred to as the electron injection layer, and the layer positioned close to the light emitting layer is referred to as the electron transport layer.

The electron injection layer has a function of improving efficiency of electron injection from the cathode. The electron transport layer has a function of improving the electron injection from the cathode, the electron injection layer, or the electron transport layer that is closer to the cathode. The hole blocking layer has a function of blocking hole transport. The electron injection layer or the electron transport layer is used also as the hole blocking layer in some cases.

Examples of the layer to be provided between the anode and the light emitting layer include a hole injection layer, a hole transport layer, an electron blocking layer, and the like. In the case where both of the hole injection layer and the hole transport layer are provided between the anode and the light emitting layer, the layer positioned close to the anode is referred to as the hole injection layer, and the layer positioned close to the light emitting layer is referred to as the hole transport layer.

The hole injection layer has a function of improving efficiency of hole injection from the anode. The hole transport layer has a function of improving the hole injection from the anode, the hole injection layer, or the hole transport layer that is closer to the anode. The electron blocking layer has a function of blocking electron transport. The hole injection layer or the hole transport layer is used also as the electron blocking layer in some cases.

The electron injection layer and the hole injection layer are collectively referred to as a charge injection layer in some cases, and the electron transport layer and the hole transport layer are collectively referred to as a charge transport layer in some cases.

Specific examples of the layer structure of the organic EL element are listed below:
a) anode/hole transport layer/light emitting layer/cathode;
b) anode/light emitting layer/electron transport layer/cathode;
c) anode/hole transport layer/light emitting layer/electron transport layer/cathode;
d) anode/charge injection layer/light emitting layer/cathode;
e) anode/light emitting layer/charge injection layer/cathode;
f) anode/charge injection layer/light emitting layer/charge injection layer/cathode;
g) anode/charge injection layer/hole transport layer/light emitting layer/cathode;

h) anode/hole transport layer/light emitting layer/charge injection layer/cathode;
i) anode/charge injection layer/hole transport layer/light emitting layer/charge injection layer/cathode;
j) anode/charge injection layer/light emitting layer/charge transport layer/cathode;
k) anode/light emitting layer/electron transport layer/charge injection layer/cathode;
l) anode/charge injection layer/light emitting layer/charge transport layer/charge injection layer/cathode;
m) anode/charge injection layer/hole transport layer/light emitting layer/charge transport layer/cathode;
n) anode/hole transport layer/light emitting layer/charge transport layer/charge injection layer/cathode; and
o) anode/charge injection layer/hole transport layer/light emitting layer/electron transport layer/charge injection layer/cathode.
(Here, the mark "/" is used for indicating that the two layers written before and after the mark "/" are laminated adjacent to each other. The same applies to the following description.)

Also, the organic EL element of the present embodiment may have two or more light emitting layers. Specific examples of the organic EL element having the two light emitting layers include those having a layer structure of p) anode/charge injection layer/hole transport layer/light emitting layer/electron transport layer/charge injection layer/electrode/charge injection layer/hole transport layer/light emitting layer/electron transport layer/charge injection layer/cathode.

Also, examples of the organic EL element having the three or more light emitting layers include, in the case where (electrode/charge injection layer/hole transport layer/light emitting layer/electron transport layer/charge injection layer) is a repeating unit, those having a layer structure having two or more repeating units, such as q) anode/charge injection layer/hole transport layer/light emitting layer/electron transport layer/charge injection layer/repeating unit/repeating unit/ . . . /cathode.

It is possible to omit the layers other than the anode, electrode, cathode, and light emitting layer in the layer structures p and q as required.

In the bottom emission type organic EL element in which light is extracted through the substrate (transparent plate 1 in the present embodiment), all of the layers arranged closer to the transparent plate 1 than the light emitting layer are composed of transparent layers. Also, in a so-called top emission type organic EL element in which light is extracted through the first electrode 8 that is arranged opposite to the substrate (transparent plate 1 in the present embodiment), all of the layers arranged closer to the first electrode 8 than the light emitting layer are composed of transparent layers.

The organic EL element may be provided with an insulating layer adjacent to the electrode and having a film thickness of 2 nm or less for enhancing adhesion with the electrode and improving the charge injection from the electrode, and, also, a thin buffer layer may be inserted between boundary faces of the adjacent layers for enhancing adhesion between and preventing mixing of the boundary faces and the like.

Hereinafter, a specific structure of each of the layers will be described.

<Hole Injection Layer>

Examples of a hole injection material constituting the hole injection layer include a phenylamine-based material, a starburst type amine-based material, a phthalocyanine-based material, oxides such as vanadium oxide, molybdenum oxide, ruthenium oxide and aluminum oxide, amorphous carbon, polyaniline, and a polythiophene derivative, and the like.

<Hole Transport Layer>

Examples of a hole transport material constituting a hole transport layer include polyvinylcarbazole or derivatives thereof, polysilane or derivatives thereof, a polysiloxane derivative having aromatic amine at a side chain or a main chain, a pyrazoline derivative, an arylamine derivative, a stilbene derivative, a triphenyldiamine derivative, polyaniline or derivatives thereof, polythiophene or derivatives thereof, polyarylamine or derivatives thereof, polypyrrole or derivatives thereof, poly(p-phenylenevinylene) or derivatives thereof, poly(2,5-thienylenevinylene) or derivatives thereof, and the like.

Among the hole transport materials, the polymer hole transport material such as polyvinylcarbazole or derivatives thereof, polysilane or derivatives thereof, polysiloxane derivative having an aromatic amine compound group at a side chain or a main chain, polyaniline or derivatives thereof, polythiophene or derivatives thereof, polyarylamine or derivatives thereof, poly(p-phenylenevinylene) or derivatives thereof, and poly(2,5-thienylenevinylene) or derivatives thereof may preferably be used as the hole transport material, more preferably polyvinylcarbazole or derivatives thereof, polysilane or derivatives thereof, polysiloxane derivative having aromatic amine at a side chain or a main chain, and the like. In the case of using a low molecular weight hole transport material, the low molecular weight hole transport material may preferably be dispersed into a polymer binder.

Examples of a method for forming a film of a hole transport layer include a method of forming a film from a mixed solution of the low molecular weight hole transport material with the polymer binder. Examples of a method of forming a film of a polymer hole transport material include a method of forming a film from a solution.

A solvent to be used in forming a film from a solution may be those capable of dissolving a hole transport material, and examples thereof include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methylethylketone, and ester-based solvents such as ethyl acetate, butyl acetate, and ethyl cellsolve acetate.

Examples of a method of forming a film from a solution include application methods such as a spin coating method, a casting method, a micro-gravure coating method, a gravure coating method, a bar coating method, a roll coating method, a wire bar coating method, a dip coating method, a spray coating method, a screen printing method, a flexographic printing method, an offset printing method, an inkjet printing method, and the like.

As the polymer binder to be mixed, those which do not extremely inhibit charge transport are preferred, and those having weak visible light absorption are suitably used. Examples of the polymer binder include polycarbonate, polyacrylate, polymethylacrylate, polymethylmethacrylate, polystyrene, polyvinyl chloride, polysiloxane, and the like.

An optimum value of a film thickness of a hole transport layer varies depending on the material to be used and is selected so as to attain an appropriate driving voltage and light emission efficiency. The hole transport layer needs to have a thickness so that generation of a pin hole is at least prevented, while a too large thickness undesirably entails a high driving voltage of the element. Therefore, the film thickness of the hole injection layer may be, for example, 1 nm to 1 μm, preferably 2 to 500 nm, and more preferably 5 to 200 nm.

<Light Emitting Layer>

The light emitting layer contains an organic substance emitting fluorescent and/or phosphorescent light or the organic substance and a dopant. The dopant is added for the purpose of improving light emission efficiency or changing a light emission wavelength, for example. The organic substance to be used for the light emitting layer may be either a low molecular weight compound or a polymer compound. Examples of the light emitting material constituting the light emitting layer include a dye-based light emitting material, a metal complex-based light emitting material, and a polymer-based light emitting material.

Examples of the dye-based light emitting material include a cyclopendamine derivative, a tetraphenylbutadiene derivative, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a pelynone derivative, a perylene derivative, an oligothiophene derivative, a trifumanylamine derivative, an oxadiazole dimmer, a pyrazoline dimmer, and the like.

Examples of the metal complex-based light emitting material include a metal complex having a representative element such as Al, Zn, and Be, a rare earth metal (e.g., Tb, Eu, or Dy), or a transition element such as Ir and Pt as a center metal and having oxadiazole, thiadiazole, phenylpyridine, phenylbenzoimidazole, or a quinoline structure as a ligand, and examples thereof include an iridium complex, a metal complex such as platinum complex emitting light from a triplet excited state, an alumiquinolinol complex, a benzoquinolinolberyllium complex, a benzooxazole zinc complex, a benzothiazole zinc complex, an azomethyl zinc complex, a porphyrin zinc complex, an europium complex, and the like.

Examples of the polymer-based light emitting material include a polyparaphenylenevinylene derivative, a polythiophene derivative, a polyparaphenylene derivative, a polysilane derivative, a polyacetylene derivative, a polyfluorene derivative, and a polyvinylcarbazole derivative as well as those obtainable by polymerizing the dye-based light emitting material and metal complex-based light emitting material, and the like.

Among the light emitting materials, examples of the material emitting blue light include a distyrylarylene derivative, an oxadiazole derivative, polymers thereof, a polyvinylcarbazole derivative, a polyparaphenylene derivative, a polyfluorene derivative, and the like. Among them, a polyvinylcarbazole derivative, a polyparaphenylene derivative, a polyfluorene derivative, and the like which are polymer materials are preferred.

Examples of the material emitting green light include a quinacridone derivative, a coumarin derivative, polymers thereof, a polyparaphenylenevinylene derivative, a polyfluorene derivative, and the like. Among them, a polyparaphenylenevinylene derivative, a polyfluorene derivative, and the like which are polymer materials are preferred.

Examples of the material emitting red light include a coumarin derivative, a thiophene ring compound, polymers thereof, a polyparaphenylenevinylene derivative, a polythiophene derivative, a polyfluorene derivative, and the like. Among them, a polyparaphenylenevinylene derivative, a polythiophene derivative, a polyfluorene derivative, and the like which are polymer materials are preferred.

Examples of the dopant material include a perylene derivative, a coumarin derivative, a rubrene derivative, a quinacridone derivative, a squarylium derivative, a porphyrin derivative, a styryl-based dye, a tetracene derivative, a pyrazolone derivative, decacyclene, phenoxazone, and the like. A thickness of the light emitting layer may usually be about 2 to 2000 nm.

Examples of a method of forming a film of a light emitting layer containing an organic substance include a method of applying a solution containing the light emitting material on a surface of a substrate, a vacuum vapor deposition method, a transfer method, and the like. Specific examples of a solvent to be used for a film formation from a solution include those that are used as the solvent for dissolving the hole transport material in forming the film of the hole transport layer from the solution.

As the method for applying the solution containing the light emitting material, it is possible to employ an application method such as a spin coating method, a casting method, a micro-gravure coating method, a gravure coating method, a bar coating method, a roll coating method, a wire bar coating method, a dip coating method, a slit coating method, a capillary coating method, a spray coating method, and a nozzle coating method or a coating method such as a gravure printing method, a screen printing method, a flexographic printing method, an offset printing method, a reverse printing method, and an inkjet printing method. In view of easy pattern formation and multicolor coating, an application method such as a gravure printing method, a screen printing method, a flexographic printing method, an offset printing method, a reverse printing method, and an inkjet printing method is preferred. Also, in the case of a low molecular weight compound having sublimation property, it is possible to employ a vacuum vapor deposition method. Further, it is possible to form the light emitting layer only at a desired position by a method such as a laser transfer method and a heat transfer method.

<Electron Transport Layer>

Examples of an electron transport material constituting an electron transport layer include oxadiazole derivatives, anthraquino-dimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, 8-hydroxyquinoline or metal complexes of derivatives thereof, polyquinoline or derivatives thereof, polyquinoxaline or derivatives thereof, and polyfluorene or derivatives thereof.

Among them, oxadiazole derivatives, benzoquinone or derivatives thereof, anthraquinone or derivatives thereof, 8-hydroxyquinoline or metal complexes of derivatives thereof, polyquinoline or derivatives thereof, polyquinoxaline or derivatives thereof, and polyfluorene or derivatives thereof may be preferably used, and 2-(4-biphenylyl)-5-(4-t-butylphenyl)-1,3,4-oxadiazole, benzoquinone, anthraquinone, tris(8-quinolinol)aluminum, and polyquinoline may be more preferably used.

Examples of a method of forming a film of an electron transport layer include a method of forming a film from a powder by vacuum vapor deposition and a method of forming a film from a solution or a molten state in the case of the low molecular weight electron transport material, and include a method of forming a film from a solution or from a molten state in the case of the polymer electron transport material. In forming a film from a solution or molten state, a polymer binder may be used in combination. Examples of the method of forming a film of the electron transport layer from a solution include the same methods as the above-described methods of forming a film of a hole transport layer from a solution.

An optimum value of a film thickness of an electron transport layer varies depending on the material to be used and is selected so as to attain an appropriate driving voltage and light emission efficiency. The electron transport layer needs to have a thickness so that generation of a pin hole is at least prevented, while a too large thickness undesirably entails a high driving voltage of the element. Therefore, the film thickness of the hole injection layer may be, for example, 1 nm to 1 μm, preferably 2 to 500 nm, and more preferably 5 to 200 nm.

<Electron Injection Layer>

Examples of an electron injection material constituting an electron injection layer include, depending on the type of the light emitting unit, an alkali metal, an alkali earth metal, an alloy containing one or more of the metals, oxides, halides, and carbonates of the metals, mixtures of these substances, and the like. Examples of the alkali metal or oxides, halides, and carbonates thereof include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. Examples of the alkali earth metal or oxides, halides, and carbonates thereof include magnesium, calcium, barium, strontium, magnesium oxide, magnesium fluoride, calcium oxide, calcium fluoride, barium oxide, barium fluoride, strontium oxide, strontium fluoride, magnesium carbonate, and the like. The electron injection layer may be a laminate that is obtained by laminating two or more layers. Specific examples of the laminate include LiF/Ca and the like. It is possible to form an electron injection layer by vapor deposition, sputtering, printing, or the like.

<Cathode>

As a material for the cathode, a material that has a small work function, facilitates electron injection into the light emitting layer, and has high conductivity is preferred. Also, since light is reflected by the cathode in the case of extracting light through the anode side, a material having high visible light reflectance is preferred as the material for the cathode. As the material for the cathode, a metal such as an alkali metal, an alkali earth metal, a transition metal, and a metal of Group III-B is usable. More specifically, as the material for the cathode, there may be used a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more of the metals, an alloy of one or more of the metals and one or more of gold, silver, platinum, copper, manganese, titanium, cobalt, nickel, tungsten, and lead, graphite, a graphite interlayer compound, and the like. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like. Also, a transparent conductive electrode may be used as the cathode, and, for example, a thin film made from a conductive metal oxide, a conductive organic substance, or the like is usable. More specifically, a thin film made of the conductive metal oxide such as indium oxide, zinc oxide, tin oxide, indium tin oxide (ITO), and indium zinc oxide (IZO) and an organic transparent conductive film made of the conductive organic substance such as polyaniline or a derivative thereof and polythiophene or a derivative thereof are usable. The cathode may have a laminate structure including two or more layers. Also, the electron injection layer may be used as the cathode in some cases.

It is possible to appropriately select a film thickness of the cathode in view of electroconductivity and durability, and the film thickness may be 10 nm to 10 μm, for example, preferably 20 to 1 μm, and more preferably 50 to 500 nm.

Examples of a production method for a cathode include a vacuum vapor deposition method, a sputtering method, a lamination method of performing thermal compression bonding of a metal thin film, and the like.

In the case of using the transparent conductive film 3 as the anode, examples of a layer of the part of the organic member 7 contacting the transparent conductive film 3 include the hole injection layer, the hole transport layer, the light emitting layer, and the like. A refractive index of the hole injection layer may usually be about 1.5 to 1.8, a refractive index of the hole transport layer may ordinarily be about 1.5 to 1.8, and a refractive index of the light emitting layer may ordinarily be about 1.5 to 1.8. The refractive index (n1) of the transparent conductive film 3 satisfies Expression (1) described above and may preferably be set so as to be equal to or less than the refractive index (n3) of the layer contacting the transparent conductive film 3.

In the conventional bottom emission type organic EL elements, ITO formed on a glass substrate has been used as the anode. Since the refractive index (n1) of ITO is about 2, the refractive index (n2) of the glass substrate is about 1.5, and the refractive index (n3) of the part (e.g., light emitting layer) contacting the ITO of the organic member is about 1.7, a structure in which ITO having the higher refractive index is sandwiched between the glass substrate and the light emitting layer having the lower refractive indexes was formed in the conventional bottom emission type organic EL elements. Therefore, since a part of light from the light emitting layer is reflected by ITO due to total reflection and the like, it was difficult to efficiently extract the light from the light emitting layer. In contrast, in the present invention, by using the transparent conductive film 3 satisfying the relationship of Expression (1) as the anode and using the transparent 1 for the organic EL element 5 in which the refractive index (n1) of the transparent conductive film 3 is equal to or less than the refractive index (n3) of the layer contacting the transparent conductive film 3 as a preferred embodiment, it is possible to configure the organic EL element having a small difference among the refractive indexes of the transparent plate main body 2, the transparent conductive film 3, and the part of the organic member 7 contacting the transparent conductive film 3 as compared to the conventional organic EL elements. Thus, reflection of the light from the light emitting layer on the transparent conductive film 3 is suppressed to make it possible to improve the light extraction efficiency of the organic EL element. Particularly, by using the transparent plate 1 satisfying the relationship of $n2 \leq n1 \leq n3$, the difference among the reflective indexes of the transparent plate main body 2, the transparent conductive film 3, and the part of the organic member 7 contacting the transparent conductive film 3 is further reduced to suppress the reflection of the light from the light emitting layer from on the transparent conductive film 3, thereby making it possible to further improve the light extraction efficiency of the organic EL element.

Also, since the organic member 7 is film-formed on the flat transparent conductive film 3 having a surface roughness Ra of 100 nm or less, it is possible to suppress fluctuation in film thickness of each of the layers. Thus it is possible to eliminate a short caused by a projection of the transparent conductive film 3.

Also, since it is possible to form the transparent conductive film 3 by the application method, it is possible to form the transparent electrode more easily and to achieve a low cost as compared to a case of forming the transparent electrode by using a vacuum device, such as vacuum vapor deposition and sputtering, or a case of forming the transparent electrode by a special step. Further, since the properties of the transparent conductive film 3 depend on the types of the resin and the wire-like conductor and the shape of the wire-like conductor, and the like, it is possible to easily obtain the transparent conductive film 3 exhibiting intended optical properties and electrical properties only by appropriately selecting them.

As described above, the organic member 7 may include the inorganic layer, and, for example, the inorganic layer may be arranged on the surface part of the organic member 4 at the side close to the second electrode 9 (transparent conductive film 3) so that the inorganic layer contacts the second electrode 9 (transparent conductive film 3). Examples of the inorganic layer include a thin film made of a phenylamine-based material, a starburst type amine-based material, a phthalocyanine-based material, an oxide such as vanadium oxide, molybdenum oxide, ruthenium oxide and aluminum oxide, amorphous carbon, polyaniline, and a polythiophene derivative, or the like. Also, a bottom emission type organic EL element that has the second electrode 9 (transparent electrode 3) serving as the cathode and the first electrode 8 serving as the anode may be configured. In this case, in order to facilitate electron injection, the inorganic layer may be arranged on the surface part of the organic member 7 at the side close to the second electrode so that the inorganic layer contacts the second electrode. Examples of the inorganic layer in this case include a thin film made of an alkali metal, an alkali earth metal, an alloy containing one or more of the metals, an oxide, a halide, or a carbide of the metal, a mixture of these substances, or the like.

Figure 3:
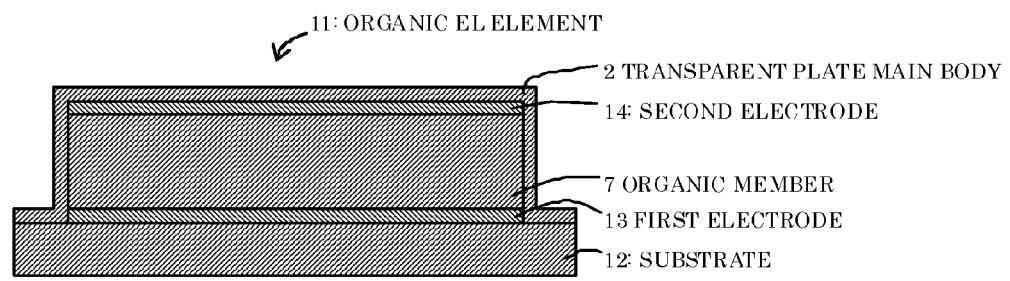
FIG. 3 is a sectional view showing an organic EL element 11 according to another embodiment.

Also, the transparent plate 1 is used as the substrate, and the transparent conductive film 3 is used as the anode in the organic EL element 5 of the present embodiment; however, the transparent plate 1 may be used as a sealing plate, and the transparent conductive film 3 may be used as the cathode. The sealing plate may be a plate member having a substantially rectangular shape or may be a film having a shape of covering the organic member 7 along the shape of the organic member 7. Hereinafter, an embodiment of: using the transparent plate main body 2 as a sealing film; causing the transparent conductive film 3 to function as the cathode; and using the transparent plate 1 as a sealing plate will be described. FIG. 3 is a sectional view showing an organic EL element 11 according to another embodiment. Since the organic EL element 11 of the present embodiment has substantially the same configuration as the organic EL element of the above-described embodiment, corresponding structures are denoted by the same reference numerals, and overlapping description is omitted in some cases. The organic EL element 11 of the present embodiment is realized by: using a substrate which is not necessarily be transparent; forming a first electrode 13 on the substrate 12 in place of the second electrode 9 of the foregoing embodiment; forming the organic member 7 on the first electrode 13; forming the transparent conductive film 3 as a second electrode 14 on the organic member 7; and forming the transparent plate main body 2 covering a laminate composed of the first electrode 13, the organic member 7, and the second electrode 14. The organic EL element 11 of the present embodiment is of the so-called top emission type wherein light is extracted through the side of the second electrode 14 which is at the side opposite to the substrate 12.

The first electrode 13 is used as the anode. As at least one of the first electrode 13 and the substrate 12, one reflecting light to the second electrode 14 is suitably used.

It is possible to form the second electrode 14 in the same manner as in the above-described transparent conductive film 3, i.e. by applying a dispersion liquid in which the above-described wire-like conductor is dispersed on the surface of the organic member 7 at the side opposite to the substrate 12, for example. The second electrode 14 functions as the cathode. In order to facilitate electron injection from the second electrode 14 (cathode), a thin film having a film thickness of about 0.1 to 5 nm may be provided between the second electrode 14 and the organic member 7. As the thin film, there may be used a thin film made of a metal such as aluminum, lithium, sodium, potassium, rubidium, cesium, beryllium, magnesium, calcium, strontium, barium, aluminum, scandium, vanadium, zinc, yttrium, indium, cerium, samarium, europium, terbium, or ytterbium, an alloy of two or more of the above-described metals, an alloy of one or more of the metals and one of gold, silver, platinum, copper, manganese, titanium, cobalt, nickel, tungsten, and lead, graphite, a graphite interlayer compound, or the like. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like. The thin film may be formed before forming the second electrode 14. As described above, the transparent plate main body 2 is realized by the sealing film including the inorganic layer of a metal, a metal oxide, a metal nitride, a metal carbide, or a metal oxynitride, a combination of the inorganic layer and an organic layer, an inorganic-organic hybrid layer, or the like, and it is possible to form the transparent plate main body 2 in such a manner as to cover a laminate made of the first electrode 13, the organic member 7, and the second electrode 14 by a vacuum vapor deposition method, a sputtering method, a lamination method of performing thermal compression bonding of a metal thin film, or the like.

According to the organic EL element 11 of the present embodiment described above, since it is possible to suppress total reflection of light from the light emitting layer on the second electrode 14 (transparent conductive film 3) in the same manner as in the organic EL element 5 of the foregoing embodiment, it is possible to improve light extraction efficiency of the organic EL element. Also, as described above, by using the transparent plate 1 satisfying the relationship of $n2 \leq n1 \leq n3$, the differences among the reflective indexes of the transparent plate main body 2, the second electrode 14 (transparent conductive film 3), and the part of the organic member 7 contacting the transparent conductive film 3 are further reduced to suppress total reflection of the from the light emitting layer on the transparent conductive film 3, thereby making it possible to further improve the light extraction efficiency of the organic EL element.

Though the second electrode 14 (transparent conductive film 3) is used as the cathode in the top emission type organic EL element in the present embodiment, the second electrode 14 (transparent conductive film 3) may be used as the anode and the first electrode 13 may be used as the cathode in a top emission type organic EL element in another embodiment. In an organic EL element of yet another embodiment, two transparent plates 1 may be provided, and one thereof may be used as the substrate and the other thereof may be used as the sealing plate.

In an organic EL element of still another embodiment, the organic EL element may have a structure that: two transparent plates 1 are provided; both thereof are used as the substrate; and the organic member 7 is held between the pair of transparent plates 1. One of the transparent conductive films 3 of the pair of transparent plates 1 functions as the anode, and the other functions as the cathode. In such an organic EL element, light is extracted from both of one direction and the other direction of a lamination direction in which the layers are laminated, it is possible to realize the organic EL element having high light extraction efficiency by the same reasons as described above.

Example 1

As a wire-like conductor, a silver nanowire (longer axis average length: 1 μm, shorter axis average length: 10 nm) whose surface was protected with an amino group-containing polymer-based dispersant (manufactured by I.C.I. Japan Co., Ltd.; trade name: Solsperse 24000SC) was used. 2 g of a toluene dispersion liquid of the silver nanowire (containing 1.0 g of the silver nanowire) and 0.25 g of trimethylolpropane triacrylate (manufactured by Shin-Nakamura Chemical Co., Ltd.; NK ester-TMPT) as a photo-curable monomer serving as a film main body were mixed, and 0.0025 g of Irgacure 907 (manufactured by Nihon Ciba Geigy, K. K.) as a polymerization initiator was added. The mixture solution was coated on a glass substrate (transparent plate main body; refractive index: n2=1.5) having a thickness of 0.7 mm, followed by drying of the solvent by heating on a hot plate at 110° C. for 20 minutes and curing by light irradiation (6000 mW/cm$^2$) with a UV lamp, thereby obtaining a transparent conductive film having a film thickness of 150 nm. By such film formation, the transparent conductive film having a transmittance of 80% or more, a volume resistivity of 1 Ω·cm or less, and a surface roughness of 100 nm or less was obtained.

The photo-curable resin had a refractive index of about 1.47, and the refractive index (n1) of the obtained transparent conductive film was also about 1.47, and therefore, an organic EL element using a transparent plate with the transparent conductive film was improved in light extraction efficiency.

Example 2

As a wire-like conductor, a silver nanowire (longer axis average length: 1 μm, shorter axis average length: 10 nm) whose surface was protected with an amino group-containing polymer-based dispersant (manufactured by I.C.I. Japan Co., Ltd.; trade name: Solsperse 24000SC) was used. 2 g of a toluene dispersion liquid of the silver nanowire (containing 1.0 g of the silver nanowire) and 2.5 g of a solution (manufactured by HC Starck-V Tech; Baytron P) of poly(ethylenedioxythiophene)/polystyrenesulfonic acid serving as a film main body were mixed. The mixture solution was coated on a glass substrate (transparent plate main body) having a thickness of 0.7 mm, followed by drying of the solvent by heating on a hot plate at 200° C. for 20 minutes, thereby obtaining a transparent conductive film having a film thickness of 150 nm. By such film formation, the transparent conductive film having a transmittance of 80% or more, a volume resistivity of 1 Ω·cm or less, and a surface roughness of 100 nm or less was obtained.

Baytron P had a refractive index (refractive index of the thin film formed only from Baytron P) of about 1.7, and the refractive index of the obtained transparent conductive film was also about 1.7, and therefore, an organic EL element using a transparent plate with the transparent conductive film was improved in light extraction efficiency.

Example 3

As a wire-like conductor, a silver nanowire (longer axis average length: 1 μm, shorter axis average length: 10 nm) whose surface was protected with an amino group-containing polymer-based dispersant (manufactured by I.C.I. Japan Co., Ltd.; trade name: Solsperse 24000SC) was used. A mixture solution of 2.5 g of a solution (manufactured by HC Starck-V Tech; Baytron P) of poly(ethylenedioxythiophene)/polystyrenesulfonic acid serving as a film main body and 0.125 g of dimethylsulfoxide was mixed with 2 g of a toluene dispersion liquid (containing 1.0 g of the silver nanowire) of the above-described silver nanowire. The mixture solution was coated on a glass substrate having a thickness of 0.7 mm, followed by drying of the solvent by heating on a hot plate at 200° C. for 20 minutes, thereby obtaining a conductive film having a film thickness of 150 nm. By such film formation, the transparent conductive film having a transmittance of 80% or more, a volume resistivity of 1 Ω·cm or less, and a surface roughness of 100 nm or less was obtained.

Baytron P had a refractive index (refractive index of the thin film formed only from Baytron P) of about 1.7, and the refractive index of the obtained transparent conductive film was also about 1.7, and therefore, an organic EL element using a transparent plate with the transparent conductive film was improved in light extraction efficiency.

INDUSTRIAL APPLICABILITY

According to the present invention, it is possible to realize a transparent plate with a transparent conductive film, which improves light extraction efficiency of organic electroluminescent elements and is to be used for an organic electroluminescent element.

Also, according to the present invention, it is possible to realize an organic electroluminescent element having high light extraction efficiency by using the transparent plate with the transparent conductive film.

Further, according to the present invention, since the transparent plate with the transparent conductive film is manufactured by employing an application method, it is possible to produce the transparent conductive film more easily as compared to a vapor deposition method, a sputtering method, and the like that require a vacuum device and the like.

The invention claimed is:

1. A transparent plate with a transparent conductive film for an organic electroluminescent element, comprising a transparent plate main body and a transparent conductive film formed on a surface of the transparent plate main body, wherein when the refractive index of the transparent conductive film is represented by n1, and the refractive index of the transparent plate main body is represented by n2, n1 and n2 satisfy the following Expression (1):

$$\begin{cases} |n2 - n1| < 0.4 \\ n1 \leq 1.8, \end{cases} \quad \text{Expression (1)}$$

and the transparent conductive film has a transmittance of light in a visible region of 80% or more, a volume resistivity of 1 Ω·cm or less, and a surface roughness of 100 nm or less, and the transparent conductive film comprises:

a transparent film main body; and a wire-like conductor arranged in the film main body and having conductivity.

2. The transparent plate with the transparent conductive film according to claim 1, wherein the transparent conductive film is formed by an application method.

3. The transparent plate with the transparent conductive film according to claim 1, wherein the wire-like conductor has a diameter of 200 nm or less.

4. The transparent plate with the transparent conductive film according to claim 3, wherein the wire-like conductor forms a network structure in the film main body.

5. The transparent plate with the transparent conductive film according to any one of claims 3 to 4, wherein the film main body comprises a resin having conductivity.

6. The transparent plate with the transparent conductive film according to any one of claims 1-2 and 3-5, wherein the transparent plate main body is a sealing film.

7. An organic electroluminescent element comprising:
a transparent plate with the transparent conductive film according to any one of claims 1-2 and 3-6;
a first electrode; and
an organic member positioned between the transparent plate with the transparent conductive film and the first electrode and including a light emitting layer containing an organic substance, wherein
the transparent conductive film of the transparent plate is positioned closer to the first electrode than the transparent plate main body and functions as a second electrode that is different from the first electrode.

8. The organic electroluminescent element according to claim 7, wherein the transparent conductive film of the transparent plate is an anode.

9. The organic electroluminescent element according to claim 7, wherein the transparent conductive film of the transparent plate is a cathode.

10. A method for producing a transparent plate with a transparent conductive film for an organic electroluminescent element, comprising:
preparing a transparent plate main body, and
forming a transparent conductive film by applying a dispersion liquid obtained by dispersing a wire-like conductor having conductivity in a dispersion medium to a surface of the transparent plate main body, wherein
when the refractive index of the transparent conductive film is represented by n1 and the refractive index of the transparent plate main body is represented by n2, n1 and n2 satisfy the following Expression (1):

$$\begin{cases} |n2 - n1| < 0.4 \\ n1 \le 1.8, \end{cases} \quad \text{Expression (1)}$$

and
a transparent conductive film having a transmittance of light in a visible region of 80% or more, a volume resistivity of 1 Ω·cm or less, and a surface roughness of 100 nm or less is formed on a surface of the transparent plate main body.

11. A method for producing a transparent plate with a transparent conductive film for an organic electroluminescent element having an organic member containing an organic substance comprising:
forming the transparent conductive film by applying a dispersion liquid obtained by dispersing a wire-like conductor having conductivity in a dispersion medium to the organic member, and
forming the transparent sealing film covering at least the transparent conductive film, wherein
when the refractive index of the transparent conductive film is represented by n1 and the refractive index of the sealing film is represented by n2, n1 and n2 satisfy the following Expression (1):

$$\begin{cases} |n2 - n1| < 0.4 \\ n1 \le 1.8, \end{cases} \quad \text{Expression (1)}$$

and
the transparent plate including the transparent conductive film having a transmittance of light in a visible region of 80% or more, a volume resistivity of 1 Ω·cm or less, and a surface roughness of 100 nm or less and a transparent sealing film covering the transparent conductive film is formed.

* * * * *